United States Patent
Yen et al.

(10) Patent No.: US 10,834,490 B2
(45) Date of Patent: Nov. 10, 2020

(54) MICROPHONE MODULE, ELECTRONIC DEVICE

(71) Applicant: Beijing Xiaomi Mobile Software Co., Ltd., Beijing (CN)

(72) Inventors: Chiafu Yen, Beijing (CN); Hui Du, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/582,180

(22) Filed: Sep. 25, 2019

(65) Prior Publication Data

US 2020/0107094 A1 Apr. 2, 2020

(30) Foreign Application Priority Data

Sep. 27, 2018 (CN) .......................... 2018 1 1133959

(51) Int. Cl.
*H04R 1/08* (2006.01)
*H04R 1/04* (2006.01)

(52) U.S. Cl.
CPC .................. *H04R 1/08* (2013.01); *H04R 1/04* (2013.01); *H04R 2410/03* (2013.01)

(58) Field of Classification Search
CPC ........ H04R 1/04; H04R 2499/11; H04R 1/02; H04R 1/086; H04R 1/08; H04R 2410/03; H04R 19/005; H04R 19/04; B81B 7/007; B81B 7/0077; B81B 7/0029; B81B 2207/097

See application file for complete search history.

(56) References Cited

U.S. PATENT DOCUMENTS

| 6,117,705 | A | 9/2000 | Glenn et al. |
| 6,841,412 | B1 | 1/2005 | Fisher et al. |
| 2008/0217709 | A1* | 9/2008 | Minervini ............. B81B 7/0061 257/416 |
| 2009/0175477 | A1 | 7/2009 | Suzuki et al. |

(Continued)

FOREIGN PATENT DOCUMENTS

| CN | 102611954 A | 7/2012 |
| CN | 203407015 U | 1/2014 |

(Continued)

OTHER PUBLICATIONS

International Search Report for Application No. PCT/CN2018/114933, dated Jul. 1, 2019.

(Continued)

*Primary Examiner* — Yogeshkumar Patel
(74) *Attorney, Agent, or Firm* — Finnegan, Henderson, Farabow, Garrett & Dunner, L.L.P.

(57) ABSTRACT

The present disclosure provides a microphone module, an electronic device, and relates to the field of electronic device technology. The microphone module includes a housing, a circuit board, a signal converter, and an adhesive member. The housing is formed with a cavity and an acoustic receiving hole which are connected with each other; the circuit board is connected to the housing to seal a bottom of the cavity; the adhesive member is provided in the cavity; the signal converter for converting an acoustic signal into an electrical signal is electrically connected to the circuit board and provided in the cavity.

14 Claims, 3 Drawing Sheets

(56) References Cited

U.S. PATENT DOCUMENTS

| | | | |
|---|---|---|---|
| 2012/0207335 A1* | 8/2012 | Spaanderman | H04R 1/04 |
| | | | 381/361 |
| 2013/0327221 A1* | 12/2013 | Roehnelt | B81B 7/0038 |
| | | | 96/154 |
| 2016/0112808 A1* | 4/2016 | Geiger | H04R 3/00 |
| | | | 381/113 |

FOREIGN PATENT DOCUMENTS

| | | |
|---|---|---|
| CN | 203989842 U | 12/2014 |
| CN | 104768112 A | 7/2015 |
| CN | 106686487 A | 5/2017 |
| CN | 207766455 U | 8/2018 |
| DE | 19721281 A1 | 12/1998 |
| KR | 20120117553 A | 10/2012 |
| KR | 101224448 B1 | 1/2013 |
| WO | WO 2007/123293 A1 | 11/2007 |
| WO | WO 2020/062469 A1 | 11/2018 |

OTHER PUBLICATIONS

Partial European Search Report for Application No. 19199554.7, dated Jan. 23, 2020.
Office Action in Russian Application No. 2019130581/28(060085) dated Jul. 14, 2020.
European Search Report in European Application No. 19199554.7 dated Jul. 3, 2020.

* cited by examiner

MICROPHONE MODULE, ELECTRONIC DEVICE

CROSS REFERENCE

This application is based upon and claims priority to Chinese Patent Application No. 201811133959.7, filed on Sep. 27, 2018, the entire contents thereof are incorporated herein by reference.

TECHNICAL FIELD

The present disclosure relates to the field of electronic device technology, and particularly to a microphone module, and an electronic device.

BACKGROUND

A microphone module is generally an indispensable part of an electronic device. Generally, the microphone module includes a housing formed with a cavity and an acoustic receiving hole, and a signal converter located in the cavity. The signal converter includes a vibrating membrane which is disposed corresponding to the acoustic receiving hole. The acoustic signal is transmitted into the cavity through the acoustic receiving hole and causes the vibrating membrane to vibrate, and thus the acoustic signal is converted into an electrical signal by the signal converter.

However, in practical applications, impurities outside the microphone module can also enter the cavity through the acoustic receiving hole and fall on the vibrating membrane. When the impurities falling on the vibrating membrane accumulate more and more, with normal vibrations of the vibrating membrane, these impurities may scratch or pierce the vibrating membrane, thereby causing the microphone module not to work normally, and even shortening the service life of the microphone module.

SUMMARY

A first aspect of the present disclosure provides a microphone module, comprising: a housing formed with a cavity and an acoustic receiving hole connected with each other; a circuit board connected to the housing to seal a bottom of the cavity; an adhesive member provided in the cavity; and a signal converter provided in the cavity and configured to convert an acoustic signal into an electrical signal.

In an embodiment, the adhesive member comprises a first adhesive member attached to an inner wall of the housing.

In an embodiment, the first adhesive member covers the inner wall of the housing.

In an embodiment, the first adhesive member extends from the cavity to the acoustic receiving hole and is attached to a side wall of the acoustic receiving hole.

In an embodiment, the adhesive member comprises a second adhesive member attached to the circuit board.

In an embodiment, the microphone module further comprises a connection layer. The connection layer may comprise oppositely provided adhesive surfaces, and the oppositely adhesive surfaces adhere to the adhesive member and a target adhered carrier, respectively.

In an embodiment, the circuit board comprises a flexible circuit board.

In an embodiment, the circuit board comprises a first flexible circuit board provided corresponding to the cavity. Cutting slits are provided on the first flexible circuit board, and connection lines of adjacent cutting slits are concentrically distributed.

In an embodiment, the circuit board comprises a second flexible circuit board located at the outside of the cavity, and interleaved distribution cutting slits are provided on the second flexible circuit board.

In an embodiment, the cutting slits comprise an arc-shaped end.

In an embodiment, the signal converter comprises an integrated circuit module connected to the flexible circuit board, and the integrated circuit module comprises components with a surrounding structure.

A second aspect of the present disclosure provides an electronic device comprising a microphone module provided by the first aspect.

The technical proposal provided by the embodiments of the present disclosure may include the following beneficial effects.

Since the adhesive member is provided in the cavity, the impurities entering the cavity through the acoustic receiving hole may be directly adhered to the adhesive member to avoid the contact with components other than the adhesive member in the cavity. Moreover, the impurities in the cavity adhere to the adhesive member during the movement by, for example, shaking the microphone module to prevent the impurities form repeatedly contacting with components other than the adhesive member. For the vibrating membrane provided in the cavity, on the one hand, the amount of the impurities in contact with the vibrating membrane may be reduced by the adhesive member, and on the other hand, the repeated contact of the impurities with the vibrating membrane may be avoided. In turn, it helps to weaken the impact and wear of the impurities on the vibrating membrane, avoid damage to the vibrating membrane, and ensure the normal use of the microphone module to extend the service life of the microphone module.

It should be understood that the above general description and the following detailed description are only illustrative and not explanatory, and do not limit the present disclosure.

BRIEF DESCRIPTION OF THE DRAWINGS

The accompanying drawings, which are incorporated into the specification and form a part of the specification, illustrate embodiments consistent with the present disclosure, and together with the specification, explain the principles of the present disclosure.

THE REFERENCE NUMERALS IN THE DRAWINGS

1, housing;
11, cavity;

12, acoustic receiving hole;
2, adhesive member;
21, first adhesive member;
22, second adhesive member;
3, circuit board;
31, first flexible circuit board;
32, second flexible circuit board;
4, signal converter;
41, vibrating membrane;
7, integrated circuit module;
5, connection layer;
6, cutting slit.

DETAILED DESCRIPTION

Exemplary embodiments will be illustrated in detail below, and examples thereof are shown in the accompanying drawings. In the description below that involves the accompanying drawings, unless otherwise indicated, the same numerals in different drawings represent the same or similar elements. The embodiments described hereinafter do not limit the present disclosure in any way. Instead, they are merely examples of devices and methods defined by the appended claims and consistent with some aspects of the present disclosure.

Figure 1:
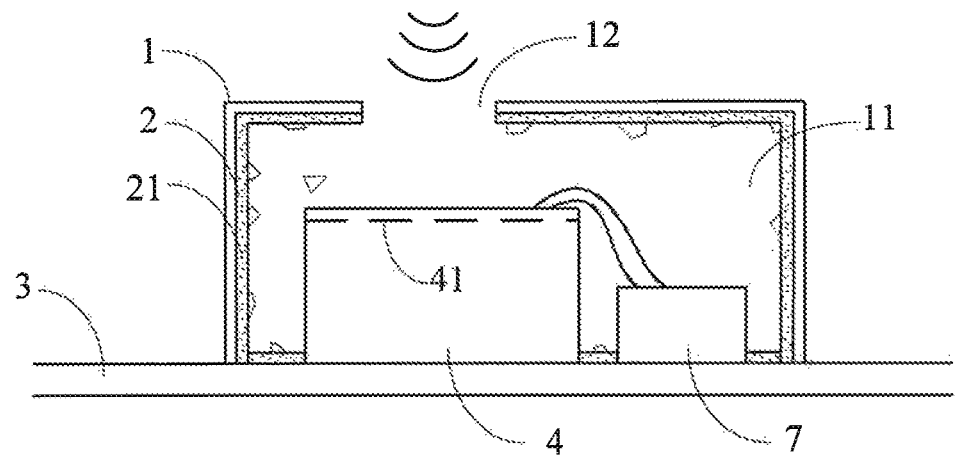
FIG. 1 is a sectional view diagram of a microphone module according to an exemplary embodiment.

FIG. 1 is a sectional view diagram of a microphone module according to an exemplary embodiment. As shown in FIG. 1, the microphone module includes a housing 1, an adhesive member 2, a circuit board 3, and a signal converter 4.

In the embodiment, the housing 1 is formed with a cavity 11 and an acoustic receiving hole 12 which are connected with each other. The adhesive member 2 is provided in the cavity 11. The circuit board 3 and the housing 1 are connected to seal the bottom of the cavity 11. The signal converter 4 for converting an acoustic signal into an electrical signal is provided in the cavity 11.

In an embodiment, the signal converter 4 includes a signal conversion component, such as a vibrating membrane 41. In such a case, the vibrating membrane 41 is provided corresponding to the acoustic receiving hole 12. Acoustic waves are introduced into the cavity 11 through the acoustic receiving hole 12 in the cavity 1. Further, the signal converter 4 located in the cavity 11 and electrically connected to the circuit board 3 receives the acoustic waves. The vibrating membrane 41 in the signal converter 4 vibrates in response to the acoustic waves, so as to generate electrical signals corresponding to the acoustic waves.

Since the adhesive member 2 is provided in the cavity 11, the impurities falling into the cavity 11 through the acoustic hole 12 may be directly adhered onto the adhesive member 2, so as to avoid contacting with components other than the adhesive member 2 in the cavity 11. Moreover, the impurities in the cavity 11 may be adhered to the adhesive member 2 by various operations, for example, shaking the microphone module, to prevent the impurities form repeatedly contacting with components other than the adhesive member 2 in the cavity 11.

For example, for the signal conversion component, such as the vibrating membrane 41 in the above embodiment, due to the microphone module provided by the embodiment of the present disclosure is used, on the one hand, the amount of the impurities in contact with the vibrating membrane 41 may be reduced by the adhesion of the impurities of the adhesive member 2, and on the other hand, repeated contacts of the impurities with the vibrating membrane 41 may be avoided. As a result, the impacts and abrasions to the vibrating membrane 41 caused by impurities may be reduced by the adhesive member 2, so as to avoid damage to the vibrating membrane 41, and ensure the normal operation of the microphone module and extend the service life of the microphone module.

In some embodiments, the adhesive member 2 may be a sheet adhesive member, a rod adhesive member, or a mesh adhesive member, etc., which is provided in the cavity 11. In one embodiment, the adhesive member 2 has a sheet-shaped structure. The sheet-shaped structure contributes to an increase of the effective adhesive area of the adhesive member 2 to sufficiently adhere the impurities.

As shown in FIG. 1, the adhesive member 2 includes a first adhesive member 21 attached on an inner wall of the housing 1. The inner wall of the housing 1 includes side walls and top walls of the cavity 11, and the first adhesive member 21 may be provided on the side walls or the top walls of the cavity 11, or the first adhesive member 21 may be attached on the inner wall of the housing 1.

Impurities in the cavity 11 may be adhered by the first adhesive member 21 attached on the inner wall of the housing 1. Further, when the first adhesive member 21 is attached on the inner wall of the housing 1, it results in that an adhesive layer is formed on the whole inner wall of the housing 1 so that a maximum adhesion area and maximum adhesion effect can be achieved.

Figure 2:
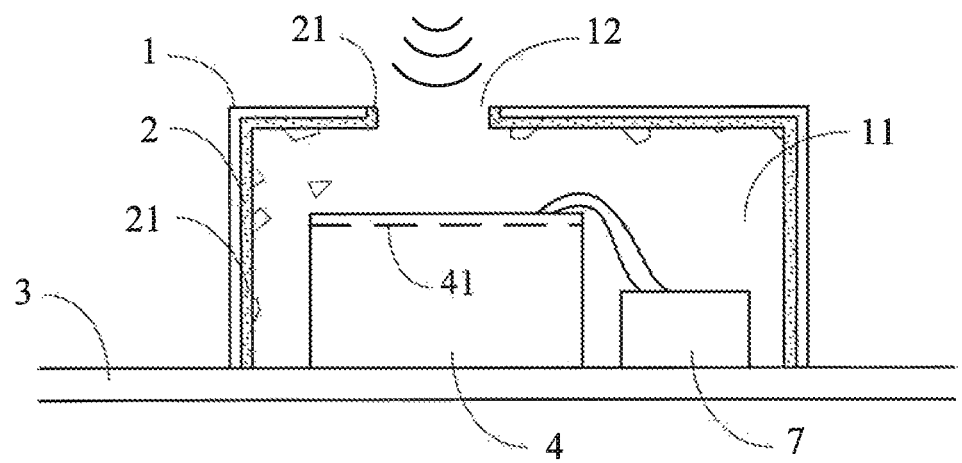
FIG. 2 is a schematic structural diagram of a microphone module according to another exemplary embodiment.

FIG. 2 is a schematic structural diagram of a microphone module according to another exemplary embodiment. As shown in FIG. 2, the first adhesive member 21 extends from the cavity 11 to the acoustic receiving hole 12 and is attached to the side wall of the acoustic receiving hole 12.

By the first adhesive member 21 extending to the acoustic receiving hole 12, the impurities may be prevented from entering the cavity 11 through the acoustic receiving hole 12, and the amount of the impurities entering the cavity 11 is fundamentally reduced. Furthermore, damages to the vibration membrane 41 caused by the impurities may be prevented. Moreover, due to the first adhesive member 21 attached to the side wall of the acoustic receiving hole 12, impurities blocking the acoustic waves from propagating into the cavity 11 through the acoustic receiving hole 12 may be avoided.

Figure 3:
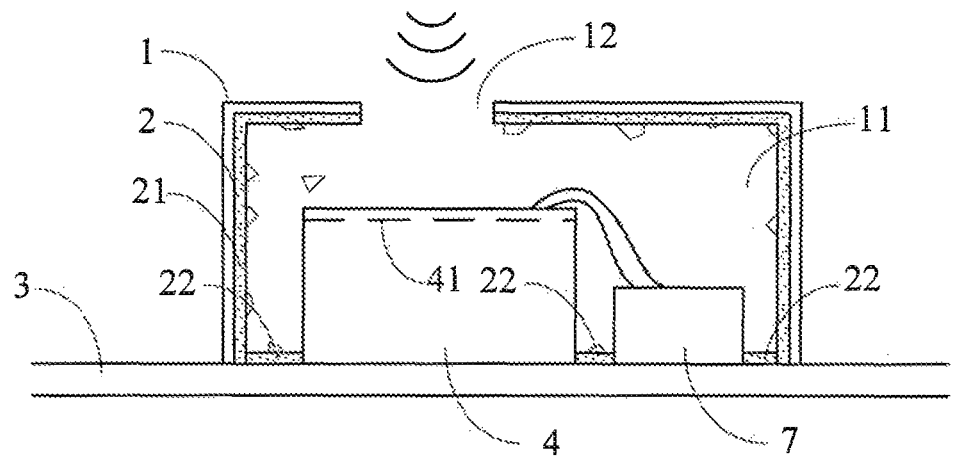
FIG. 3 is a schematic structural diagram of a microphone module according to another exemplary embodiment.

FIG. 3 is a schematic structural diagram of a microphone module according to another exemplary embodiment. In one embodiment, as shown in FIG. 3, the adhesive member 2 includes the second adhesive member 22 attached on the circuit board 3. If some impurities are not adhered on the first adhesive member 21, they will fall on the circuit board 3 that seals the cavity 11. In this case, the impurities that fall on the circuit board 3 are adhered on the second adhesive member 22. It should be noted that, in this embodiment, the second adhesive member 22 is attached on and covers a portion of the circuit board 3 where no structures such as wiring or solder joints are provided, and it results in that an adhesive layer with a hollow pattern is formed on the circuit board 3. In this way, effective adhesion of the impurities can be achieved, and at the same time, the normal operation of the circuit board 3 can be ensured.

Figure 4:
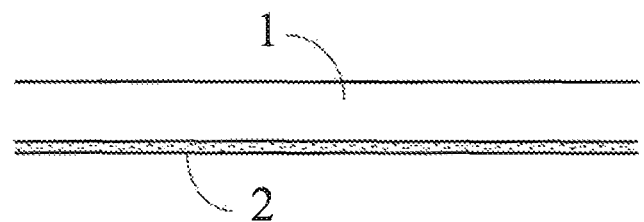
FIG. 4 is a sectional view diagram of a connection between an adhesive member and a housing according to an exemplary embodiment.
Figure 5:
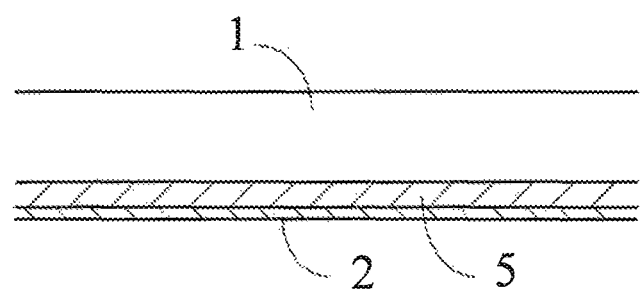
FIG. 5 is a sectional view diagram of a connection between an adhesive member and a housing according to another exemplary embodiment.

FIG. 4 is a sectional view diagram of an adhesive member and a housing according to an exemplary embodiment. FIG. 5 is a sectional view diagram of an adhesive member and a housing according to another exemplary embodiment.

In one embodiment, as shown in FIG. 4, the adhesive member 2 is directly attached to the target adhered carrier. When the adhesive member 2 may stably adhere to the target adhered carrier, the adhesive member 2 may be directly attached to the target adhered carrier to simplify the manufacturing process. In this embodiment, the target adhered carrier may be the housing 1 and/or the circuit board 3. In FIG. 4, only the housing 1 is taken as an example.

In another embodiment, as shown in FIG. 5, the microphone module further includes a connection layer 5. The connection layer 5 includes oppositely provided adhesive surfaces, and the oppositely adhesive surfaces respectively adhere to the adhesive member 2 and a target adhered carrier. The adhesive member 2 is connected to the target adhered carrier by the connection layer 5. In this embodiment, the adhesive member 2 has a different viscosity from the connection layer 5, so that when the connection layer 5 may not stably adhere to the target adhered carrier, a stable connection of the adhesive member 2 and the target adhered carrier is realized by the connection layer 5. In this way, various materials may be selected for the adhesive member 2, to achieve the desired adhesion effect. The target adhered carrier may be the housing 1 and/or the circuit board 3. In FIG. 5, only the housing 1 is taken as an example.

In the embodiment of the present disclosure, the material of the adhesive member 2 is not particularly limited, and may be, e.g., a viscous gel, viscous oil, or an adhesive used in the related art.

In one embodiment, the circuit board 3 includes a flexible circuit board. Compared to the printed circuit board, the flexible circuit board has the characteristics of high wiring density, light weight, thin thickness and good bending characteristics. The microphone module provided with the flexible circuit board may be more aptly assembled with other components or modules by virtue of the good bending property of the flexible circuit board.

In this case, as shown in FIG. 1, the converter 4 may include a Microelectro Mechanical Systems (MEMS) sensor, and an integrated circuit module 7, wherein, the MEMS sensor includes a vibrating membrane 41, and the integrated circuit module 7 is electrically connected to the MEMS sensor.

Further, the integrated circuit module 7 is connected to the flexible circuit and includes components with a surrounding structure such as a resistor, a capacitor, and so on. Compared to a linear structure, the surrounding structure may reduce the length and the width of the components, and thus can be provided on the flexible circuit board with a thinner thickness to facilitate to reduce the size of the integrated circuit module 7, thereby reducing the mounting space required for the integral of the microphone module.

Figure 6:
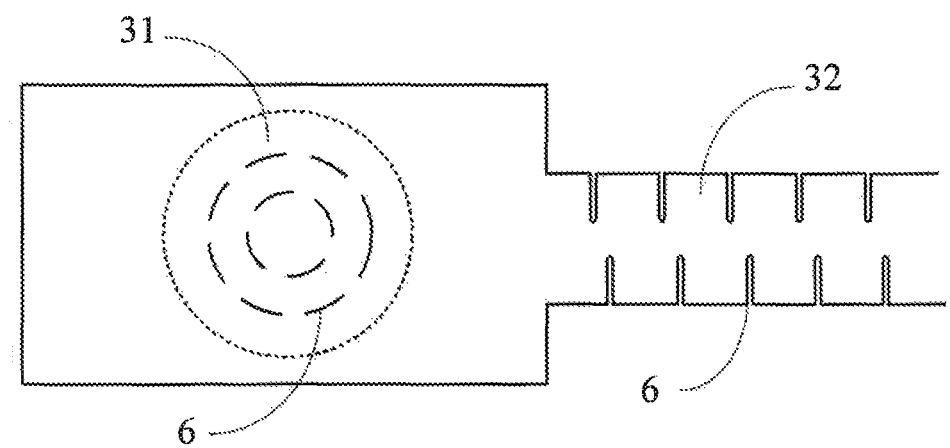
FIG. 6 is a top view diagram of a microphone module according to an exemplary embodiment.

FIG. 6 is a top view diagram of a microphone module according to an exemplary embodiment. In one embodiment, as shown in FIG. 6, the circuit board 3 includes the first flexible circuit board 31 covering the cavity 11. Cutting slits 6 are provided on the first flexible circuit board 31, and the connection lines of adjacent cutting slits 6 are concentrically distributed.

The deformability of the first flexible circuit board 31 may be further increased by providing the first flexible circuit board 31 on the cutting slits 6. In addition, the connection lines of adjacent cutting slits 6 are concentrically distributed to optimize the ductility of the first flexible circuit board 31, which may generate a convex deformation or a concave deformation with the center of the cutting slit as a vertex. In this case, the first flexible circuit board 31 may be stably attached to the protruding or recessed component to improve the mounting stability of the microphone module. In an embodiment, the connection lines of adjacent cutting slits 6 may take concentric ring shapes.

In one embodiment, as shown in FIG. 6, the circuit board 3 includes the second flexible circuit board 32 located at the outside of the cavity 11. Interleaved distribution cutting slits 6 are provided on the second flexible circuit board 32.

The second flexible circuit board 32 located at the outside of the cavity 11 may connect the microphone module with other modules or components. Interleaved distribution cutting slits 6 provided on the second flexible circuit board 32 may further increase the deformability of the second flexible circuit board 32. For example, as shown in FIG. 6, the cutting slits 6 are provided along the width direction of the second flexible circuit board 32. In this case, it helps to increase the elasticity of the flexible circuit board 32. It should be understood that, when the flexible circuit board 32 is stretched, the width of the cutting slits 6 is increased, and the length of the flexible circuit board 32 is increased. The elasticity of the flexible circuit board 32 is improved by the cutting slits 6, so that when the microphone module and the modules or devices connected thereto are relatively displaced, the flexible circuit board 32 is still continuous, and the breakage is prevented from affecting the normal use of the microphone module.

In this embodiment, the shape of the cutting slits 6 may vary. For example, the shape of the cutting slits 6 may be selected from a rectangle, a fusiform, a line, etc. As an alternative, the cutting slits include an arc-shaped end, such as an elliptical shape and so on. The stress concentration at the end of the cutting slits 6 is reduced by the arc-shaped end, and the circuit board 3 is prevented from being torn by the cutting slits 6 to ensure the safety of the device.

The present disclosure also provides an electronic device, and the electronic device includes the microphone module described above. Since the electronic device has the microphone module described above, the electronic device has the beneficial effect of the microphone module, and details are not described herein again.

In addition, in the embodiments of the present disclosure, there is no specific limitation on the type of the electronic device. Illustratively, the electronic device may be a mobile phone, a computer, a laptop, a digital broadcasting electronic device, a game console, a tablet device, a medical device, a fitness equipment, a personal digital assistant, etc.

Other embodiments of the present disclosure will be readily contemplated by those skilled in the art after considering the specification and practicing the present disclosure herein. The specification is intended to cover any variations, uses, or adaptations of the present disclosure, which are in accordance with the general principles of the present disclosure and include common general knowledge or conventional technical means in the art that are not disclosed in the present disclosure.

It should be understood that the present disclosure is not limited to the precise structures described above and shown in the drawings, and various modifications and changes may be made without departing from their scope. The scope of the present disclosure is restricted only by the appended claims.

What is claimed is:

1. A microphone module, comprising:
    a housing, formed with a cavity and an acoustic receiving hole which are connected with each other;
    a circuit board connected to the housing to seal a bottom of the cavity;
    an adhesive member provided in the cavity; and
    a signal converter provided in the cavity and configured to convert an acoustic signal into an electrical signal,
    wherein the adhesive member comprises a first adhesive member that is attached to an inner wall of the housing and contacts only the inner wall of the housing, and wherein the first adhesive member extends from the cavity to the acoustic receiving hole and is attached to a side wall of the acoustic receiving hole.

2. The microphone module according to claim 1, wherein the first adhesive member covers the inner wall of the housing.

3. The microphone module according to claim 1, wherein the adhesive member comprises a second adhesive member attached to the circuit board.

4. The microphone module according to claim 1, further comprising a connection layer;
wherein the connection layer comprises oppositely provided adhesive surfaces, and the oppositely adhesive surfaces adhere to the adhesive member and a target adhered carrier.

5. The microphone module according to claim 1, wherein the circuit board comprises a flexible circuit board.

6. The microphone module according to claim 5, wherein the circuit board comprises a first flexible circuit board covering the cavity; and
cutting slits are provided on the first flexible circuit board, and connection lines of adjacent cutting slits are concentrically distributed.

7. The microphone module according to claim 5, wherein the circuit board comprises a second flexible circuit board located at an outside of the cavity; and
interleaved distribution cutting slits are provided on the second flexible circuit board.

8. The microphone module according to claim 6, wherein each of the cutting slits comprises an arc-shaped end.

9. The microphone module according to claim 7, wherein each of the cutting slits comprises an arc-shaped end.

10. The microphone module according to claim 5, wherein the signal converter comprises an integrated circuit module connected to the flexible circuit board, and the integrated circuit module comprises a component having a surrounding structure.

11. An electronic device, comprising a microphone module according to claim 1.

12. The microphone module according to claim 2, further comprising a connection layer;
wherein the connection layer comprises oppositely provided adhesive surfaces, and the oppositely adhesive surfaces adhere to the adhesive member and a target adhered carrier, respectively.

13. The microphone module according to claim 1, further comprising a connection layer;
wherein the connection layer comprises oppositely provided adhesive surfaces, and the oppositely adhesive surfaces adhere to the adhesive member and a target adhered carrier, respectively.

14. The microphone module according to claim 3, further comprising a connection layer;
wherein the connection layer comprises oppositely provided adhesive surfaces, and the oppositely adhesive surfaces adhere to the adhesive member and a target adhered carrier, respectively.

* * * * *